US008133798B2

(12) United States Patent
Ohshiba

(10) Patent No.: US 8,133,798 B2
(45) Date of Patent: Mar. 13, 2012

(54) METHOD FOR PRODUCING INK-JET HEAD

(75) Inventor: Hisashi Ohshiba, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 2 days.

(21) Appl. No.: 12/712,026

(22) Filed: Feb. 24, 2010

(65) Prior Publication Data

US 2010/0233833 A1 Sep. 16, 2010

(30) Foreign Application Priority Data

Mar. 13, 2009 (JP) ................................ 2009-061356

(51) Int. Cl.
*H01L 21/76* (2006.01)

(52) U.S. Cl. ...................................................... 438/444

(58) Field of Classification Search ........................ None
See application file for complete search history.

(56) References Cited

U.S. PATENT DOCUMENTS 4,047,184 A * 9/1977 Bassous et al. ................. 347/76
4,630,356 A * 12/1986 Christie et al. ................ 438/444
5,136,310 A * 8/1992 Drews ............................. 347/45
2007/0069619 A1* 3/2007 Lifka et al. .................... 313/292
2007/0200877 A1* 8/2007 Arakawa ........................... 347/1

FOREIGN PATENT DOCUMENTS

JP 2003-094665 A 4/2003

* cited by examiner

*Primary Examiner* — Charles Garber
*Assistant Examiner* — Andre' C Stevenson
(74) *Attorney, Agent, or Firm* — Fish & Richardson P.C.

(57) ABSTRACT

There is provided a method for producing an ink jet head. The method includes: first oxidizing in which, in an SOI substrate having a first $SiO_2$ layer between a first Si layer and a second Si layer, among the first Si layer and the second Si layer, at least the first Si layer is thermally oxidized to form a second $SiO_2$ layer; forming a nozzle hole by removing a part of the second $SiO_2$ layer and a part of the first Si layer between the first $SiO_2$ layer and the second $SiO_2$ layer, by performing an etching treatment until at least the first $SiO_2$ layer is exposed; second oxidizing in which a side wall of at least the first Si layer in the formed nozzle hole is thermally oxidized to form an $SiO_2$ layer; opening the nozzle hole by subjecting the $SiO_2$ layers in the nozzle hole other than at the side wall to an anisotropic dry etching treatment until at least the second Si layer is exposed; and forming a nozzle by removing the second Si layer.

10 Claims, 2 Drawing Sheets

METHOD FOR PRODUCING INK-JET HEAD

CROSS-REFERENCE TO RELATED APPLICATION

This Application claims priority under 35 USC 119 from Japanese Patent Application No. 2009-061356, filed on Mar. 13, 2009, the disclosure of which is incorporated by reference herein.

BACKGROUND OF THE INVENTION

1. Technical Field

The present invention relates to a method for producing an ink jet head that ejects ink.

2. Description of the Related Art

An ink jet head provided in an image recording apparatus such as a printer or a copier performs recording by ejecting ink drops from an ejection nozzle that ejects the ink. Therefore, the form or accuracy of the nozzle, or changes therein over time, greatly influence the ink drop ejection performance.

In addition, the surface of a member forming the nozzle hole may influence the ink drop ejection performance depending on the properties thereof or changes therein over time.

As ink jet heads, in general, those in which a nozzle portion of a nozzle plate is formed using silicon (Si) are widely known. Regarding the configuration of the nozzle plate, for example, an ink jet head having an inorganic oxide layer formed between a nozzle-forming member and a fluorine-containing water-repellent layer, the inorganic oxide layer having the shape of an island-like thin layer in which island-like separated inorganic oxide films are uniformly formed as a whole, has been disclosed (see, for example, Japanese Patent Application Laid-open (JP-A) No. 2003-94665).

SUMMARY OF THE INVENTION

However, when the nozzle portion, which contacts ink, of the nozzle plate is formed of silicon and the silicon surface contacts the ink, it is easily eroded by an alkaline component or the like in the ink. This may affect the ink drop ejection performance, and, consequently, affect the durability of the ink-jet head.

In the above configuration of a conventional ink jet head, the inorganic oxide is formed in a separated form and exists only in an island-like state. Therefore, contact between the inner wall surface of the nozzle hole and the ink cannot be prevented and, since the inner wall contacts the ink, it is difficult to suppress or avoid erosion of the wall surface.

The invention has been made in view of the above circumstances and provides a method for producing an ink jet head.

According to an aspect of the present invention, a method for producing an ink jet head is provided. The method includes: first oxidizing in which, in an SOI substrate having a first $SiO_2$ layer between a first Si layer and a second Si layer, among the first Si layer and the second Si layer, at least the first Si layer is thermally oxidized to form a second $SiO_2$ layer; forming a nozzle hole by removing a part of the second $SiO_2$ layer and a part of the first Si layer between the first $SiO_2$ layer and the second $SiO_2$ layer, by performing an etching treatment until at least the first $SiO_2$ layer is exposed; second oxidizing in which a side wall of at least the first Si layer in the formed nozzle hole is thermally oxidized to form an $SiO_2$ layer; opening the nozzle hole by subjecting the $SiO_2$ layers in the nozzle hole other than at the side wall to an anisotropic dry etching treatment until at least the second Si layer is exposed; and forming a nozzle by removing the second Si layer.

DETAILED DESCRIPTION OF THE INVENTION

Figure 1A:
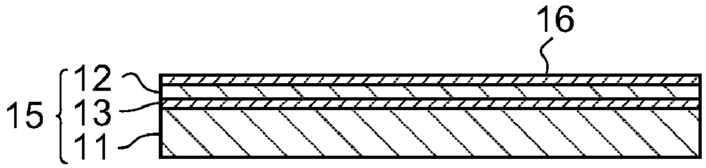
FIGS. 1A to 1F are an outline process view showing a part of the production process of an ink jet head according to an embodiment of the present invention.

A method for producing an ink jet head of the present invention includes: first oxidizing in which, in an SOI substrate having a first $SiO_2$ layer between two Si layers (a first Si layer and a second Si layer), among the two Si layer (the first Si layer and the second Si layer), at least the first Si layer is thermally oxidized to form a second $SiO_2$ layer (first oxidizing process); forming a nozzle hole by removing a part of the second $SiO_2$ layer and a part of the first Si layer between the first $SiO_2$ layer and the second $SiO_2$ layer, by performing an etching treatment until at least the first $SiO_2$ layer is exposed (nozzle hole formation process); second oxidizing in which a side wall of at least the first Si layer in the formed nozzle hole is thermally oxidized to form an $SiO_2$ layer (second oxidizing process); opening the nozzle hole by subjecting the $SiO_2$ layers in the nozzle hole other than at the side wall to an anisotropic dry etching treatment until at least the second Si layer is exposed (hole opening process); and forming a nozzle by removing the other Si layer (second Si layer) (nozzle formation process).

In the method for producing an ink jet head of the invention, the nozzle hole formation process is preferably a process including forming an etching mask on the second $SiO_2$ layer by a photoresist method (mask formation process); removing a part of the second $SiO_2$ layer by an etching treatment until the Si layer between the first $SiO_2$ layer and the second $SiO_2$ layer is exposed ($SiO_2$ removal process); removing the exposed Si layer by an anisotropic wet etching treatment or an anisotropic dry etching treatment until the first $SiO_2$ layer is exposed (Si removal process); and removing the etching mask (mask removal process).

In the nozzle formation process in the method for producing the ink jet head of the invention, the other Si layer (second Si layer) may be polished, and, after that, a dry etching treatment may be performed until the first $SiO_2$ layer is exposed, thereby removing the other Si layer (the second Si layer). The SOI substrate has two Si layers, and, when the second $SiO_2$ layer is formed at one of the Si layers, the other can be used as a handle layer for handling and, therefore, it is possible to perform the production with good operability without breakage even when forming a thin type product.

The method for producing an ink jet head of the invention may include, after the hole opening process and before the removing of the other Si layer (second Si layer) in the nozzle formation process, connecting at least a part of a surface of the exposed second $SiO_2$ layer and a base wafer having an ink flow path. Accordingly, it is possible to produce an ink jet head having excellent ink resistant properties.

It is preferable that, in the nozzle hole formation process, a part of the first $SiO_2$ layer is also removed until the Si layer is exposed, and, in the second oxidization process, the $SiO_2$ layer is formed on the whole exposed surface of the Si layer of the formed nozzle hole. Since, as the result of the etching treatment in the hole opening process, the $SiO_2$ layer of the side wall may also tend to become thin, by previously removing the $SiO_2$ layer to be removed prior to the second oxidization process, such problem that the $SiO_2$ layer of the side wall becomes thin can be prevented.

At least the first $SiO_2$ layer preferably has a thickness within the range of from 0.5 μm to 1 μm. Particularly, when, the nozzle hole formation process is a simple process which does not include removing a part of the first $SiO_2$ layer until the Si layer is exposed, the thickness of the $SiO_2$ layer within the range makes it possible, in the hole opening process later, to perform the nozzle hole opening without affecting the side wall.

In either the first oxidization process or the second oxidization process, or in both processes, preferably the $SiO_2$ layer is formed in a thickness of from 0.5 μm to 1 μm.

Hereinafter, while referring to FIGS. 1A to 1F and 2G to 2J, embodiments of the method for producing an ink jet head of the invention will be described in detail. In FIG. 1A to 1F and 2G and 2J, the same reference symbols denote the same parts.

As shown in FIG. 1A, in order to produce a nozzle plate having a nozzle, an SOI substrate (silicon on insulator wafer) 15, which has such structure that an embedded $SiO_2$ layer 13 is provided as the first $SiO_2$ layer between a Si substrate (hereinafter, referred to as a "Si handle layer") 11 and a surface Si layer 12, is prepared. The SOI substrate is a substrate having such structure that $SiO_2$ is inserted between a Si layer that is a base material and a Si layer that is the surface layer.

In the SOI substrate, no particular limitation is imposed on the thickness of the $SiO_2$ layer and Si layer, but, for example, the thickness of the $SiO_2$ layer is preferably in the range of 0.5 μm to 10 μm, and the thickness of the Si layer is preferably in the range of from 10 μm to 300 μm. The thickness of the embedded $SiO_2$ layer 13 embedded between the Si layers is preferably relatively thin, and is more preferably in the range of from 0.5 μm to 1 μm, from the standpoint of decreasing an adverse effect on the side wall upon opening the nozzle hole.

As the SOI substrate, the substrate having a structure as shown in FIG. 1(*a*) may be used, or a commercially available product may be used.

Next, using the SOI substrate 15, the surface Si layer 12 thereof is at least thermally oxidized to further form a $SiO_2$ layer 16 (the second $SiO_2$ layer) on the SOI substrate (the first oxidization process), as shown in FIG. 1A. Using the SOI substrate and further providing the $SiO_2$ layer to form a structure of $SiO_2$ layer/Si layer/$SiO_2$ layer, it is possible to finally form the nozzle inner wall and the surface of the ink flow path side with a $SiO_2$ layer, and also form the nozzle face with a $SiO_2$ layer, as described below.

On the condition of the thermal oxidization, no particular limitation is imposed, and it may be appropriately selected so as to give an intended oxidized film.

The $SiO_2$ layer 16 preferably has a thickness in the range of from 0.5 μm to 10 μm. The $SiO_2$ layer 16 is a layer that contacts the ink when it is connected with the base wafer, for which the ink flow path is provided, to form a head, and, therefore, when the thickness thereof is in the above range, the erosion by the ink may be effectively suppressed.

Figure 1B:
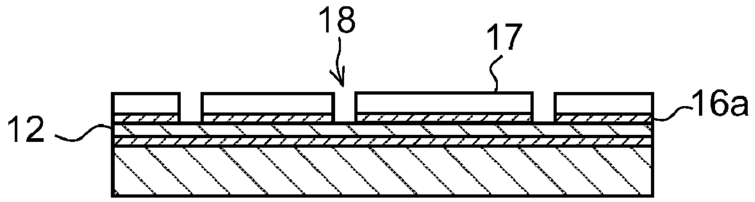

On the $SiO_2$ layer 16 formed on the SOI substrate 15, as shown in FIG. 1B, an etching mask 17 may be disposed in an intended pattern as a mask for etching. The etching mask can be formed by a photolithographic method.

Specifically, firstly, on the formed $SiO_2$ layer 16, a positive type or negative type photoresist (photosensitive resin) is coated, which is dried to form a not shown photoresist layer. When forming the photoresist layer, preferably a pre-bake treatment is further performed. Subsequently, the photoresist layer is subjected to exposure from above so that the region corresponding to the position where the nozzle hole is to be formed is to be removed, which is subjected to a development treatment with a developer after the exposure to remove the photoresist layer of the region where the nozzle hole is to be formed, and, as shown in FIG. 1B, the etching mask 17 is formed (a mask formation process).

As the photoresist, a negative type or positive type resist composition, which is sensitive to radiation such as ultraviolet ray (such as g-ray or i-ray), far ultraviolet ray including excimer laser or the like, electron beam, ion beam or X ray, may be used. The exposure of the photoresist layer can be performed by exposing the negative type or positive type resist composition with ultraviolet ray or the like through an intended mask pattern. On the developer, no particular limitation is imposed as long as it dissolves exposed portions of the positive resist or non-cured portions of the negative resist. An organic solvent, an alkaline aqueous solution or the like may be used.

The mask formation process results in a state in which, in the $SiO_2$ layer 16, only a region corresponding to the region where the nozzle hole is to be formed is exposed. In the state where the etching mask 17 is formed in this manner, a wet etching treatment is performed to the $SiO_2$ layer 16 from the above of the etching mask 17 using buffered hydrofluoric acid (BHF), to remove the $SiO_2$ layer 16 in the pattern shape of the etching mask ($SiO_2$ removal process). Accordingly, the patterned $SiO_2$ layer **16*a*** is formed. In the etching treatment, as a wet etching liquid, $H_3PO_4$, $NH_4OH$, $H_2SO_4$ or the like may be used other than BHF.

The etching treatment is ended when the Si layer 12 is exposed. In this way, as shown in FIG. 1B, concave portions 18 are formed in the patterned shape.

The etching here may be performed by dry etching, instead of the wet etching. The wet etching and dry etching can be performed by an established ordinary method. The dry etching is described in detail below.

Figure 1C:
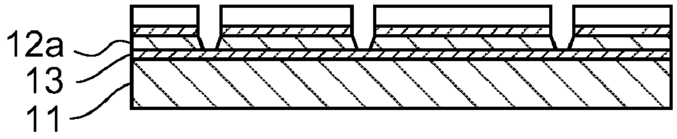

Subsequently, as shown in FIG. 1C, by further performing anisotropic wet etching using a potassium hydroxide aqueous solution in the state shown in FIG. 1B, the surface Si layer 12 is removed in the same pattern shape as that in FIG. 1B to form a patterned Si layer **12*a* (Si removal process). In the etching, the $SiO_2$ layer is used as a stopper, and the etching is ended when the embedded $SiO_2$ layer 13 is exposed. At this time, in the concave portion 18, the embedded $SiO_2$ layer 13** is exposed.

Figure 1D:
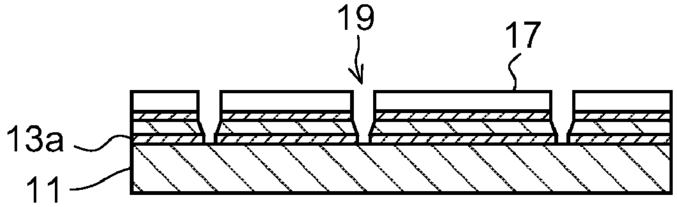

Subsequently, as shown in FIG. 1D, by further performing anisotropic dry etching in the state shown in FIG. 1C, the embedded $SiO_2$ layer 13 is removed in the same pattern as that in FIG. 1B to form a patterned embedded $SiO_2$ layer **13*a*. In the anisotropic dry etching, the Si layer is used as a stopper, and the anisotropic dry etching is ended when the Si handle layer 11 is exposed. On this occasion, a concave shape 19** that is going to constitute the nozzle hole is formed. Conditions for the anisotropic dry etching may be set, for example, as follows.

<Conditions>

Dry etching apparatus: an oxide film anisotropic etching apparatus (manufactured by Applied Materials, Inc.)

RF power: 800 W

Chamber pressure: 4 Pa

Substrate temperature: 50° C.

Kind and flow volume of gasses: Ar-800 mL, $CHF_3$-200 mL, $O_2$-50 mL

As the gas used for the dry etching treatment, a publicly known etching gas may be used, and preferable examples include a fluorine-containing gas (such as $CF_4$, $C_2F_6$, $C_3F_8$, $C_2F_4$, $C_4F_8$, $C_4F_6$, $C_5F_8$ or $CHF_3$), an inert gas (such as He, Ne, Ar, Kr or Xe), a halogen-containing gas (such as $CCl_4$, $CClF_3$, $AlF_3$ or $AlCl_3$), $O_2$, $N_2$, CO, $CO_2$ and the like, and a mixed gas of a fluorine-containing gas and oxygen gas, and the like.

As representative examples of the dry etching method, methods described in respective gazettes of JP-A Nos. 59-126506, 59-46628, 58-9108, 58-2809, 57-148706 or 61-41102 are known.

In the invention, when the thickness of the embedded $SiO_2$ layer 13 is relatively small (preferably from 0.5 μm to 1 μm), without performing the operation of removal of the embedded $SiO_2$ layer 13 as shown in FIG. 1D prior to the second oxidization process which is described below, the second oxidization process may be performed after the removal of the surface Si layer 12 as shown in FIG. 1C. But, when the thickness of the embedded $SiO_2$ layer 13 is relatively large (for example, more than 1 μm), by previously removing the embedded $SiO_2$ layer 13 prior to the second oxidization process, it is possible to suppress, for example, the $SiO_2$ layer 21 of the side wall of the nozzle hole becoming thin upon removing the $SiO_2$ layer 22 in the subsequent hole opening process (see FIG. 1F) or the like. That is, the $SiO_2$ layer 21 of the side wall may also tend to become thin in the hole opening process (see FIG. 1F). However, by previously removing the $SiO_2$ layer 22, it is possible to prevent such situation that the side wall becomes thin.

After that, a treatment for removing the photoresist layer is performed using a solvent or a photoresist removal liquid to remove the etching mask 17. By the removal of the etching mask, the patterned $SiO_2$ layer 16*a* is exposed.

As described above, the nozzle hole of a nozzle through which ink passes finally is formed.

Figure 1E:
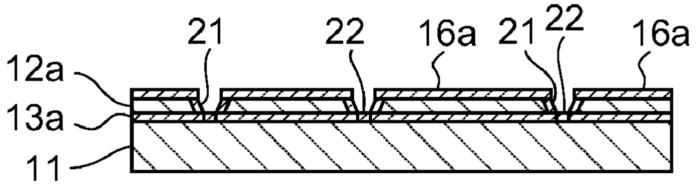

Next, after removing the etching mask and drying the resulting product, by performing again a heat treatment to thermally oxidize the surface Si layer 12 and the Si handle layer 11 exposed in the nozzle hole, respectively, a $SiO_2$ layer is formed on the whole surface of the nozzle hole (the second oxidization process). At this time, as shown in FIG. 1E, the $SiO_2$ layer 21 is formed on the side surface of the nozzle hole, and the $SiO_2$ layer 22 is formed on the surface of the Si handle layer 11 in the nozzle hole (the bottom surface in the nozzle hole shown in FIG. 1E). In the invention, by performing the thermal oxidization treatment in this way to form the $SiO_2$ layer in the nozzle hole, the ink resistant property can be improved.

The conditions of the thermal oxidization are not particularly limited, and may appropriately be selected so as to give an intended oxidized film.

The thickness of the $SiO_2$ layers 21 and 22 is preferably in the range of from 0.5 μm to 10 μm. Particularly, when the layer 21 is connected with a base wafer provided with an ink flow path to form a head, the $SiO_2$ layer 21 contacts the ink and, therefore, when the thickness is in the above range, the erosion by the ink may effectively be suppressed.

Figure 1F:
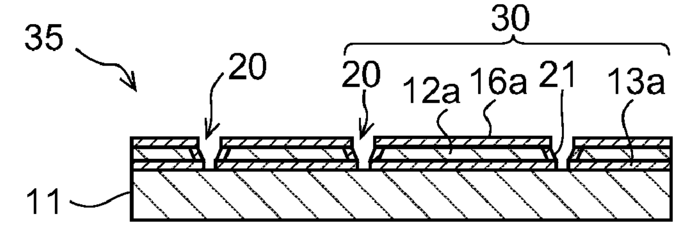

After forming the $SiO_2$ layer on the side surface of the nozzle hole by thermal oxidization, an anisotropic dry etching treatment is performed so as to selectively remove the $SiO_2$ layer 22 but so as not to remove the $SiO_2$ layer 21 of the nozzle hole side surface, to open the nozzle hole, as shown in FIG. 1F (the hole opening process). Here, the Si layer is used as a stopper, and the anisotropic dry etching is ended when the Si handle layer 11 is exposed. The method, etching gas, conditions and the like of the anisotropic dry etching treatment here are the same as those described above.

In this way, a nozzle plate laminate 35 in which a nozzle 20 is formed is obtained. In the invention, as shown in FIG. 1F, the produced nozzle plate laminate 35 has the Si handle layer 11, and, therefore, even when the nozzle plate 30 is formed in a thinner shape, it can be produced with good operability without damage.

Figure 2G:
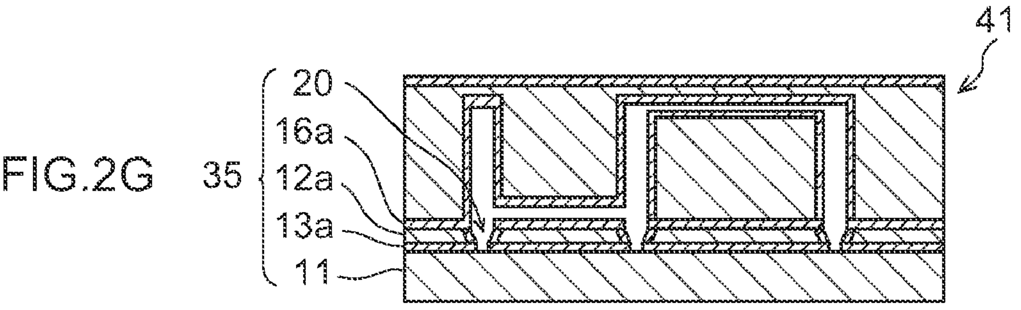
FIGS. 2G to 2J are an outline process view showing another part of the production process of an ink jet head according to an embodiment of the invention.

By using the nozzle plate laminate 35 produced as above and connecting a base wafer 41 that has separately been produced to the surface of the exposed $SiO_2$ layer 16*a*, a head structure is formed, as shown in FIG. 2G. For the head structure, an ink flow path, through which the ink to be ejected flows, is previously formed, and the structure is connected so that the ink flow path is communicated with the nozzle 20 of the nozzle plate laminate.

Figure 2H:
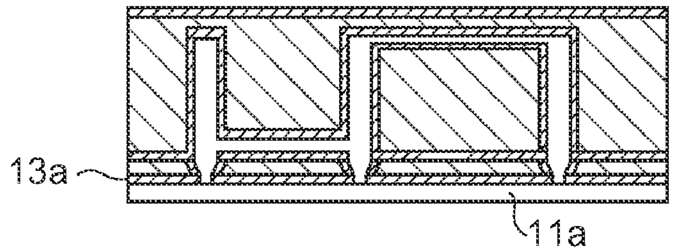

Then, in order to remove the Si handle layer 11 from the head structure, firstly a polishing treatment is performed so as to grind a part of the Si handle layer 11, as shown in FIG. 2H, to process it to be thin. In the SOI substrate, by performing the grinding, the thin shaped nozzle plate can be produced with good operability without damage.

Figure 2I:
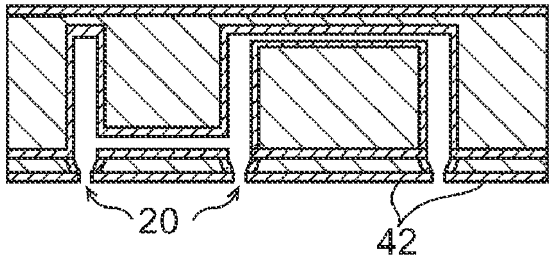

After making the Si handle layer be thin, the dry etching treatment is performed again, and, as shown in FIG. 2I, all the remained thin Si handle layer 11*a* is removed. At this time, the $SiO_2$ layer is used as a stopper and the dry etching is ended when the embedded $SiO_2$ layer 13*a* is exposed. When the dry etching is ended, the embedded $SiO_2$ layer 13*a* is exposed to form a nozzle face 42 of the ink jet head.

Figure 2J:
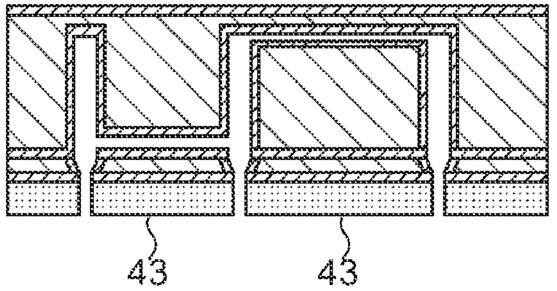

After that, in order to lower an ink-affinity property of the nozzle face, a fluorine-containing ink repellent agent may be supplied to the surface of the formed nozzle face 42 to form an ink repellent layer 43, as shown in FIG. 2J. The ink repellent layer 43 may be formed by coating by a publicly known coating method using a spin coater, a roll coater or the like. The thickness of the ink repellent layer may appropriately selected in accordance with various conditions such as the kind or amount of the ink repellent agent to be used, or properties of the ink.

Examples of the ink repellent agent that may be used include FDTS (1H,1H,2H,2H-perfluorodecyltrichlorosilane), NONOS film manufactured by T&K, and Cytop film manufactured by Asahi Glass Co., Ltd.

According to the invention, it is possible to provide a method for producing an ink jet head capable of producing an ink jet head that is excellent in an ink resistant property and has a long period reliability.

The present invention includes the following exemplary embodiments. However, the invention is not limited to the following exemplary embodiments.

<1> A method for producing an ink jet head, the method comprising:

first oxidizing in which, in an SOI substrate having a first $SiO_2$ layer between a first Si layer and a second Si layer, among the first Si layer and the second Si layer, at least the first Si layer is thermally oxidized to form a second $SiO_2$ layer;

forming a nozzle hole by removing a part of the second $SiO_2$ layer and a part of the first Si layer between the first $SiO_2$ layer and the second $SiO_2$ layer, by performing an etching treatment until at least the first $SiO_2$ layer is exposed;

second oxidizing in which a side wall of at least the first Si layer in the formed nozzle hole is thermally oxidized to form an $SiO_2$ layer;

opening the nozzle hole by subjecting the $SiO_2$ layers in the nozzle hole other than at the side wall to an anisotropic dry etching treatment until at least the second Si layer is exposed; and forming a nozzle by removing the second Si layer <2> The method for producing an ink jet head according to <1>, wherein the forming of the nozzle hole comprises:

forming an etching mask on the second $SiO_2$ layer by a photoresist method;

removing a part of the second $SiO_2$ layer by an etching treatment until the first Si layer between the first $SiO_2$ layer and the second $SiO_2$ layer is exposed;

removing the exposed first Si layer by an anisotropic wet etching treatment or an anisotropic dry etching treatment until the first $SiO_2$ layer is exposed; and removing the etching mask.

<3> The method for producing an ink jet head according to <1> or <2.>, wherein, in the forming of the nozzle, the second Si layer is polished and is subjected to a dry etching treatment until the first $SiO_2$ layer is exposed, thereby removing the second Si layer.

<4> The method for producing an ink jet head according to any one of <1> to <3>, wherein the method further comprises, after the opening of the nozzle hole and before the removing of the second Si layer in the forming of the nozzle, connecting at least a part of a surface of the exposed second $SiO_2$ layer and a base wafer having an ink flow path.

<5> The method for producing an ink jet head according to any one of <1> to <4>, wherein, in the forming of the nozzle hole, a part of the first $SiO_2$ layer is also removed until the second Si layer is exposed and, in the second oxidizing, the $SiO_2$ layer is formed on the whole exposed surface of the first Si layer and the second Si layer of the formed nozzle hole.

<6> The method for producing an ink jet head according to any one of <1> to <5>, wherein the thickness of at least the first $SiO_2$ layer is from 0.5 μm to 1 μm.

<7> The method for producing an ink jet head according to any one of <1> to <6>, wherein in at least one of the first oxidizing or the second oxidizing, at least one of the formed second $SiO_2$ layer or the $SiO_2$ layer has a thickness of from 0.5 μm to 1 μm.

<8> The method for producing an ink jet head according to any one of <1> to <7>, wherein the first Si layer and the second Si layer each independently has a thickness of from 10 μm to 300 μm.

<9> The method for producing an ink jet head according to <4>, further comprising, after the removing of the second Si layer, supplying a fluorine-containing ink repellent agent to a surface of the first $SiO_2$ layer to dispose an ink repellent layer.

<10> The method for producing an ink jet head according to <9>, wherein the fluorine-containing ink repellent agent is 1H, 1H, 2H, 2H-perfluorodecyltrichlorosilane.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing an ink jet head, the method comprising:

first oxidizing in which, in an SOI substrate having a first $SiO_2$ layer between a first Si layer and a second Si layer, the first Si layer being disposed on a surface of the second Si layer, among the first Si layer and the second Si layer, at least the first Si layer is thermally oxidized to form a second $SiO_2$ layer;

forming a nozzle hole by removing a part of the second $SiO_2$ layer and a part of the first Si layer between the first $SiO_2$ layer and the second $SiO_2$ layer, by performing an etching treatment until at least the first $SiO_2$ layer is exposed;

second oxidizing in which a side wall of at least the first Si layer in the formed nozzle hole is thermally oxidized to form an $SiO_2$ layer;

opening the nozzle hole by subjecting the $SiO_2$ layers in the nozzle hole other than at the side wall to an anisotropic dry etching treatment until at least the second Si layer is exposed; and forming a nozzle by removing the second Si layer.

2. The method for producing an ink jet head according to claim 1, wherein the forming of the nozzle hole comprises:

forming an etching mask on the second $SiO_2$ layer by a photoresist method;

removing a part of the second $SiO_2$ layer by an etching treatment until the first Si layer between the first $SiO_2$ layer and the second $SiO_2$ layer is exposed;

removing the exposed first Si layer by an anisotropic wet etching treatment or an anisotropic dry etching treatment until the first $SiO_2$ layer is exposed; and removing the etching mask.

3. The method for producing an ink jet head according to claim 1, wherein, in the forming of the nozzle, the second Si layer is polished and is subjected to a dry etching treatment until the first $SiO_2$ layer is exposed, thereby removing the second Si layer.

4. The method for producing an ink jet head according to claim 1, wherein the method further comprises, after the opening of the nozzle hole and before the removing of the second Si layer in the forming of the nozzle, connecting at least a part of a surface of the exposed second $SiO_2$ layer and a base wafer having an ink flow path.

5. The method for producing an ink jet head according to claim 1, wherein, in the forming of the nozzle hole, a part of the first $SiO_2$ layer is also removed until the second Si layer is exposed and, in the second oxidizing, the $SiO_2$ layer is formed on the whole exposed surface of the first Si layer and the second Si layer of the formed nozzle hole.

6. The method for producing an ink jet head according to claim 1, wherein the thickness of at least the first $SiO_2$ layer is from 0.5 μm to 1 μm.

7. The method for producing an ink jet head according to claim 1, wherein in at least one of the first oxidizing or the second oxidizing, at least one of the formed second $SiO_2$ layer or the $SiO_2$ layer has a thickness of from 0.5 μm to 1 μm.

8. The method for producing an ink jet head according to claim 1, wherein the first Si layer and the second Si layer each independently has a thickness of from 10 μm to 300 μm.

9. The method for producing an ink jet head according to claim 4, further comprising, after the removing of the second Si layer, supplying a fluorine-containing ink repellent agent to a surface of the first $SiO_2$ layer to dispose an ink repellent layer.

10. The method for producing an ink jet head according to claim 9, wherein the fluorine-containing ink repellent agent is 1H,1H,2H,2H-perfluorodecyltrichlorosilane.

* * * * *